United States Patent [19]
Santhanam et al.

[11] Patent Number: 5,364,209
[45] Date of Patent: Nov. 15, 1994

[54] CVD AND PVD COATED CUTTING TOOLS

[75] Inventors: Anakkavur T. Santhanam, Monroeville; Rajendra V. Godse, Greensburg; Dennis T. Quinto, Greensburg; Kenneth E. Undercoffer, Greensburg; Prem C. Jindal, Greensburg, all of Pa.

[73] Assignee: Kennametal Inc., Latrobe, Pa.

[21] Appl. No.: 183,445

[22] Filed: Jan. 14, 1994

Related U.S. Application Data

[63] Continuation of Ser. No. 925,890, Aug. 6, 1992, abandoned, which is a continuation of Ser. No. 583,889, Sep. 17, 1990, abandoned.

[51] Int. Cl.$^5$ .................. B23B 27/14; B23B 27/16
[52] U.S. Cl. ................... 407/119; 407/113; 428/698
[58] Field of Search .......... 407/113, 119; 51/295, 51/307, 309; 428/698

[56] References Cited

U.S. PATENT DOCUMENTS

| | | | |
|---|---|---|---|
| 3,755,866 | 9/1973 | Ohlsson | 407/119 |
| 3,882,579 | 5/1975 | Peacock | 407/119 |
| 3,955,038 | 5/1976 | Lindstrom et al. | 407/119 X |
| 4,035,541 | 7/1977 | Smith et al. | 428/217 |
| 4,101,703 | 7/1978 | Schintlmeister | 428/216 |
| 4,268,569 | 5/1981 | Hale | 72/462 X |
| 4,402,994 | 9/1983 | Kobayashi et al. | 427/38 |
| 4,426,267 | 1/1984 | Munz et al. | 204/192 |
| 4,448,802 | 5/1984 | Buhl et al. | 427/42 |
| 4,497,874 | 2/1985 | Hale | 428/551 |
| 4,610,931 | 9/1986 | Nemeth et al. | 428/547 |
| 4,640,869 | 2/1987 | Loth | 428/469 |
| 4,686,156 | 8/1987 | Baldoni, II et al. | 428/698 |
| 4,708,037 | 11/1987 | Buljan et al. | 82/1 C |
| 4,720,437 | 1/1988 | Chudo et al. | 428/698 |
| 4,770,946 | 9/1988 | Yamauchi et al. | 428/626 |
| 4,776,863 | 10/1988 | Van Den Berg et al. | 51/295 |
| 4,828,612 | 5/1989 | Yohe | 75/238 |
| 4,902,395 | 2/1990 | Yoshimura | 204/192.3 |
| 4,966,501 | 10/1990 | Nomura et al. | 407/119 |
| 4,984,940 | 1/1991 | Bryant et al. | 407/119 |
| 5,075,181 | 12/1991 | Quinto et al. | 428/698 |

FOREIGN PATENT DOCUMENTS

| | | | |
|---|---|---|---|
| 0166708A2 | 1/1986 | European Pat. Off. . | |
| 0191554 | 8/1986 | European Pat. Off. . | |
| 0149024 | 2/1987 | European Pat. Off. . | |
| 0385283A2 | 9/1990 | European Pat. Off. . | |
| 148349 | 5/1981 | Germany . | |
| 53-025282 | 3/1978 | Japan . | |
| 0025282 | 3/1978 | Japan | 407/119 |
| 54-010491 | 1/1979 | Japan . | |
| 0010491 | 1/1979 | Japan | 407/119 |
| 0073392 | 6/1979 | Japan | 407/119 |
| 54-073392 | 6/1979 | Japan . | |
| 0038755 | 11/1979 | Japan | 407/119 |
| 9038755 | 11/1979 | Japan . | |
| 78158372 | 3/1981 | Japan . | |
| 0098670 | 6/1982 | Japan | 407/119 |
| 50798670 | 6/1982 | Japan . | |
| 0158372 | 9/1982 | Japan | 407/119 |
| 57-192259 | 11/1982 | Japan . | |
| 0192260 | 11/1982 | Japan | 407/119 |
| 57-192260 | 11/1982 | Japan . | |
| 59-18474 | 4/1984 | Japan . | |
| 62-009808 | 1/1987 | Japan . | |
| 2009808 | 1/1987 | Japan | 407/119 |
| 62-56564 | 3/1987 | Japan . | |

(List continued on next page.)

OTHER PUBLICATIONS

Bonetti et al, "CVD of Titanium Carbonitride at Moderate Temperatures," Surface Modification Technologies III (1990) proceedings held in Switzerland Aug. 28–Sep. 1, 1989, pp. 291–308.

(List continued on next page.)

*Primary Examiner*—William E. Terrell
*Attorney, Agent, or Firm*—John J. Prizzi

[57] ABSTRACT

Provided is a coated cutting tool having a coating and a substrate. The coating includes at least one chemical vapor deposited (CVD) layer and at least one physical vapor deposited (PVD) layer. The outermost layer of the coating is a PVD layer, containing residual compressive stresses. The substrate is a composite having hard refractory grains bonded together by a binder material.

17 Claims, 1 Drawing Sheet

FOREIGN PATENT DOCUMENTS

| | | |
|---|---|---|
| 62-192576 | 8/1987 | Japan . |
| 2192576 | 8/1987 | Japan ............................ 407/119 |
| 62-214166 | 9/1987 | Japan . |
| 2214166 | 9/1987 | Japan ............................ 407/119 |
| 62-270764 | 11/1987 | Japan . |
| 2270764 | 11/1987 | Japan ............................ 407/119 |
| 01104773 | 4/1989 | Japan . |
| 1104773 | 4/1989 | Japan ............................ 407/119 |
| 01183310 | 7/1989 | Japan . |
| 1183310 | 7/1989 | Japan ............................ 407/119 |
| 02030406 | 1/1990 | Japan . |
| 2030406 | 1/1990 | Japan ............................ 407/119 |
| 02109619 | 4/1990 | Japan . |
| 2109619 | 4/1990 | Japan ............................ 407/119 |
| 1601224 | 10/1981 | United Kingdom . |

OTHER PUBLICATIONS

"Mill With Coated Inserts? Sure!" Modern Machine Shop, Oct. 1987, pp. 52–59. Ken Gettelman, Editor, Interview with James L. Hunt.

A. T. Santhanam et al, "Innovations in Coated Carbide Cutting Tools," Metal Powder Report, vol. 42, No. 12, Dec. 1987, pp. 840–845.

V. K. Sarin, "Cemented Carbide Cutting Tools," Advances in Powder Technology, Material Science Seminar, Louisville, Kentucky, ed. by G. Y. Chin (1981), pp. 253–288.

Japanese Industrial Standard JIS B4053 (1987) "Applications of Carbides for Machining by Chip Removal Designation."

Japanese Industrial Standard JIS B4104 (1978) "Cemented Carbide Tips".

International Standard ISO-R513-1975(E) "Application of Carbides for Machining by Chip Removal—Designation of the Main Groups of Chip Removal and Groups of Application."

Buhl et al, "Tin Coatings on Steel," Thin Solid Films, vol. 80 (1981) pp. 265–270.

Munz et al, "A High Rate Sputtering Process for the Formation of Hard Friction-Reducing Tin Coatings on Tools," Thin Solid Films, vol. 96 (1982), pp. 79–86.

Kamachi et al, "A Comparison of Residual Stresses in Cemented Carbide Cutting Tips Coated with Tin by the CVD & PVD Processes & Their Effect on Failure Resistance," Surfacing Journal Intl., vol. 1, No. 3 (1986) pp. 82–86.

Dearnley et al, "Evaluation of Failure Mechanisms of Ceramics & Coated Carbides Used for Machining Stainless Steels," Surface Engineering, vol. 2, No. 3 (1986) pp. 191–202.

Wolfe et al, "The Role of Hard Coatings in Carbide Milling Tools," J. Vac. Sci. Technol., A3 (1986) pp. 2747–2754.

Quinto et al, "High Temperature Microhardness of Hard Coatings Produced by Physical & Chemical Vapor Deposition," Thin Solid Films, vol. 153 (1987) pp. 19–36.

Jindal et al, "Load Dependence of Microhardness of Hard Coatings," Surface & Coatings Technology, vol. 36 (1988), pp. 683–694.

Jindal et al, "Adhesion Measurements of Chemically Vapor Deposited Hard Coatings on WC-CO Substrates," Thin Solid Films, vol. 54 (1987) pp. 361–375.

Rickerby et al, "Correlation of Process System Parameters with Structure & Properties of Physically Vapour-Deposited Hard Coatings," Thin Solid Films, vol. 157 (Feb. 1988) pp. 195–222.

Quinto et al, "Mechanical Properties, Structure & Performance of Chemically Vapour-Deposited & Physically Vapor Deposited Coating Carbide Tools," Materials Sci. & Eng., A105/A106 (1988) pp. 443–452.

Quinto, "Mechanical Property & Structure Relationships in Hard Coatings for Cutting Tools," J. Vac. Sci. Technol. A6(3), May/Jun. 1988, pp. 2149–2157.

Torok et al, "Young's Modulus of TiN, TiC, ZrN, and HfN," Thin Solid Films, 153 (1987), pp. 37–43.

American National Standard for Cutting Tools—Indexable Inserts—Identification (ANSI) B212.4–1986.

"Kennametal/81 Milling Cutters for Greater Productivity," Catalogue No. A80-105(75)HO (1980) pp. 1–92.

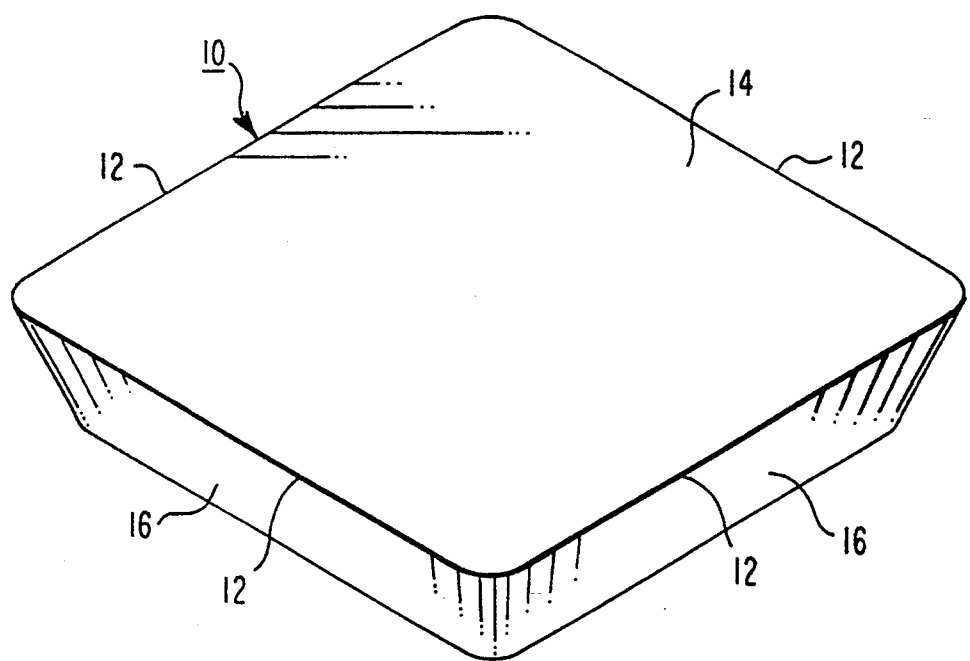

CVD AND PVD COATED CUTTING TOOLS

This is a continuation of copending application Ser. No. 07/925,890, filed on Aug. 6, 1992, now abandoned, which is a continuation of Ser. No. 07/583,889, filed on Sep. 17, 1990, now abandoned.

BACKGROUND OF THE INVENTION

The present invention relates to the field of coated cutting tools.

In the past, cemented carbide cutting tools have been used in both a coated and an uncoated condition to machine metals and alloys. The application of a coating having one or more layers of a refractory material to a tungsten carbide-cobalt cemented carbide substrate has been used to improve the wear resistance and application range of cemented carbide cutting tools. In the past, refractory coatings, such as TiC, TiCN, TiN, and $Al_2O_3$, have been applied by CVD (chemical vapor deposition) techniques. In addition, TiN coatings have been applied by PVD (physical vapor deposition) techniques. Such CVD coatings deposited on cemented carbide substrates are characterized by thermal cracks, and residual tensile stresses. PVD TiN coatings are characterized by a dense, pore free structure without thermal cracks, and may have residual compressive stresses. The application of CVD coatings to cemented carbide substrates results in a reduction in the transverse rupture strength of the insert and, therefore, produces a greater susceptibility to chipping and breakage during use.

SUMMARY OF THE INVENTION

Applicants have now discovered that the transverse rupture strength of CVD coated cemented carbide may be improved by applying a PVD layer to the CVD coated substrate. In order to provide the aforementioned improvements, it is believed that the PVD coating must contain residual compressive stresses.

Therefore, in accordance with the present invention, improved cutting tools are provided having a substrate coated with one or more CVD layers and one or more PVD layers. The outermost layer of the CVD and PVD layers preferably is a PVD layer having residual compressive stresses. The substrate is a composite material having hard refractory grains (e.g., WC) bonded together by a binder material, preferably, metallic (e.g., Co).

These and other aspects of the present invention will become more apparent upon review of the detailed specification in conjunction with the FIGURE which is briefly described below:

BRIEF DESCRIPTION OF THE DRAWINGS

The FIGURE shows an isometric view of an embodiment of a cutting tool in accordance with the present invention.

DETAILED DESCRIPTION OF THE INVENTION

In accordance with the present invention, the FIGURE shows a preferred embodiment of an indexable cutting insert 10 having cutting edges 12 at the junction of rake face 14 with flank faces 16. The cutting insert 10 shown in the FIGURE is an SPGN-433 (ANSI B212.4-1986) which may be in a sharp, or preferably, honed cutting edge condition.

In a preferred embodiment, the substrate is a WC based cemented carbide substrate containing at least 70 weight percent WC, and more preferably, at least 80 weight percent WC. The binder is preferably cobalt or a cobalt alloy and, preferably, has a bulk concentration of 5 to 15 weight percent. More preferably, the bulk cobalt content is about 7 to about 13 weight percent, and most preferably, about 8 to about 12 weight percent. The substrate may also preferably contain solid solution carbide forming elements such as Ti, Hf, Zr, Nb, Ta, V, preferably selected from Ti, Nb and Ta alone or in combination with each other. These elements preferably may be added to the mix as an element, alloy, carbide, nitride or carbonitride. Preferably, the concentration of these elements is as follows: Ta 0–12 w/o; Ti 0–10 w/o and Nb 0–6 w/o. More preferably, the sum of Ta plus Nb is between about 3 to about 7 w/o and the titanium content is between about 0.5 to 10 w/o. Most preferably, the titanium content is about 1.5 to 4.0 w/o.

These elements form solid solution carbides with the WC in the substrate. Chromium, preferably as $Cr_3C_2$, may also be added in small amounts.

Bonded on to the substrate is a hard refractory coating having at least two layers, a CVD layer and a PVD layer, with the last PVD layer preferably being outside the last CVD layer. Applicants have found that, when the PVD layer also has a compressive residual stress, that the transverse rupture strength of the CVD coated article is improved.

In a preferred embodiment, the inner CVD layer is preferably a hard nitride, such as the nitrides of Ti, Hf, Zr, their alloys with each other and their alloys with other elements, and more preferably Ti, Zr or Hf nitride. Nitrides are preferred over refractory carbides or carbonitrides for the inner layer adjacent to the substrate in order to minimize the formation of eta phase ($Co_3W_3C$ and/or $Co_6W_6C$) at the cemented tungsten carbide based substrate peripheral boundary. Eta phase is a brittle phase which may make the cutting edge more susceptible to chipping. A second layer in the coating is preferably a CVD hard carbonitride, or carbide, such as Ti, Zr or Hf carbonitride or carbide, because of the higher hardness and abrasion resistance of the carbides and carbonitrides of Ti, Zr and Hf compared to their nitrides. Carbonitrides of the alloys of Ti, Hf and Zr with each other and their alloys with other elements may also be utilized. The CVD second layer and any additional CVD layers may include, for example, alumina, either as a single layer or multiple layers separated from each other by a layer of another refractory material, such as a nitride, carbonitride or carbide of Ti, Hf or Zr, preferably, Ti.

Where it is desired to have an $Al_2O_3$ CVD layer next to the outer PVD layer, it is preferred, in order to improve the bond strength between the $Al_2O_3$ and the PVD layer that a CVD nitride, carbonitride or carbide layer of Ti, Hf or Zr is deposited between the alumina CVD layer and the PVD layer.

The final and outermost layer of the coating is preferably a hard refractory PVD layer, such as a nitride, carbonitride of Ti, Zr or Hf, their alloys with each other, and their alloys with other elements. This outermost layer is characterized by residual compressive stresses.

The present invention is further illustrated by the following examples which are provided purely for illustration and not limitation.

The effect of coatings on the transverse rupture strength of cemented carbide substrate was demonstrated by applying the following coatings on a conventional WC-6 weight percent cobalt-0.5 weight percent $Cr_3C_2$ cemented carbide substrate.

Coatings

1. CVD {TiN (1 μm)/TiCN (3 μm)/TiN (4 μm)}
2. CVD {TiN (1 μm)/TiCN (3 μm)}/PVD TiN (4 μm)
3. PVD TiN (8 μm)

The CVD coatings were applied by conventional CVD techniques at about 950 to 1000 cegrees Centigrade. The PVD TiN coating was applied with a Balzers BAI-830 (Balzers AG, Liechtenstein) ion plating PVD coating unit at about 500 degrees Centigrade using a titanium source and a nitrogen atmosphere (see U.S. Pat. No. 4,448,802). As is common practice during the initial stages of coating a very thin layer (detectable by high resolution TEM) of titanium was deposited on the CVD TiCN layer to provide improved adhesion between it and the PVD-TiN layer. The PVD layer produced by this technique has compressive residual stresses.

The transverse rupture strength of transverse rupture bars coated as described above and in an uncoated condition were measured using the ASTM standard B406 transverse rupture test procedure. The transverse rupture strength data are given below in Table I.

TABLE I

|  | Average TRS (Ksi) | Standard Deviation (Ksi) |
|---|---|---|
| Uncoated | 559 | 27 |
| Coating 1 (CVD) | 193 | 12 |
| Coating 2 (CVD + PVD) | 281 | 11 |
| Coating 3 (PVD) | 566 | 58 |

As shown by the examples, the application of CVD layers to a cemented carbide substrate results in a drastic decrease in transverse rupture strength. This reduction is believed to be due to: (a) the high temperature annealing effect of the CVD deposition temperature (950–1000 degrees Centigrade) which reduces beneficial compressive residual stresses in the surface due to grinding of the cemented carbide substrate; and (b) the presence of thermal cracks and residual tensile stresses in the CVD layers caused by thermal expansion mismatch between the coating and the cemented carbide substrate.

The deposition of PVD TiN over the CVD {TiN/TiCN} partially restores the loss in TRS observed with CVD coating alone. This improvement (about 45 percent) in TRS is believed to be due to the presence of compressive residual stresses and the absence of thermal cracks within the outer PVD TiN layer.

It, therefore, follows that a coating of solely PVD should not degrade transverse rupture properties. This is shown by the results of the samples coated with coating 3.

It is the applicants' belief that, in view of the above results, combinations of CVD and PVD coatings may be applied to a variety of cemented carbide substrates to obtain improvements in the overall properties and performance of the material. It is contemplated that this invention may be used to its best advantage where the cobalt content of the substrate is 7 to 13 weight percent and, more preferably, 8 to 12 weight percent. Specific examples of substrates where the present invention may be applied are as follows:

Substrate 1 11.5 w/o Co, 2.5 w/o Ta (Nb)C, 86 w/o WC - 89.8 $R_A$, Hc 160 Oe, A and/or B porosity Substrate 2 6.0 w/o Co, 0.5 w/o $Cr_3C_2$, 93.5 w/o WC - 93 $R_A$, Hc 300 Oe, A and/or B porosity (used in Table I examples)

Substrate 3 9.75 w/o Co, 90.25 w/o WC - 91 $R_A$, Hc 200 Oe, A and/or B porosity Substrate 4 10 w/o Co, 90 w/o WC - 89 $R_A$, Hc 120 Oe, A and/or B porosity Substrate 5 10.5 w/o Co, 10 w/o Ta(Nb)C, 7 w/o TiC, 72.5 w/o WC - 91.4 $R_A$, Hc 180 Oe, A and/or B porosity Substrate 6 8.5 w/o Co, 11 w/o Ta(Nb)C, 7.5 w/o TiC, 73 w/o WC - 91.2 $R_A$, Hc 140 Oe, A and/or B porosity CVD and PVD coated binder enriched substrates and other embodiments of the present invention are described in copending application U.S. Ser. No. 07/583,544 entitled "Binder Enriched CVD and PVD Coated Cutting Tool," filed on the same date as the present application, now U.S. Pat. No. 5,250,367. This copending application describes the application of these cutting inserts to milling of steel and shows the superiority of binder enriched grades over nonenriched grades in the severe milling applications described therein. The present applicants believe that, for less severe milling applications and turning applications, the application of CVD+PVD coatings to nonenriched substrates as described in the present application should be sufficient to provide improved chipping resistance.

All applications, patents and other documents referred to herein are hereby incorporated by reference.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A cutting tool comprising:
   a rake face and a flank face;
   a cutting edge at a junction of said rake face and said flank face;
   said cutting tool having a coating and a substrate;
   wherein said substrate is a nonbinder enriched tungsten carbide based cemented carbide having a bulk composition of:
   0–12 weight percent Ta;
   0–6 weight percent Nb;
   0–10 weight percent Ti;
   8–12 weight percent Co;
   said coating having a number of layers;
   said layers including at least one chemical vapor deposition layer and at least one physical vapor deposition layer;
   wherein the outermost layer of said chemical vapor deposition layer and said physical vapor deposition layer is said physical vapor deposition layer;
   wherein said chemical vapor deposition layer is adjacent to said substrate;
   and wherein said physical vapor deposition layer is in a state of residual compressive stress.

2. The cutting tool according to claim 1 wherein said chemical vapor deposition layer includes a layer composed of a hard nitride selected from the group consisting of Ti, Hf, Zr, their alloys with each other and their alloys with other elements.

3. The cutting tool according to claim 2 wherein the hard nitride layer is adjacent to said substrate.

4. The cutting tool according to claim 3 wherein said physical vapor deposition layer is selected from the group consisting of the nitrides and carbonitrides of Ti, Zr, Hf, their alloys with each other, and their alloys with other elements.

5. The cutting tool according to claim 3 wherein said chemical vapor deposition layer further includes a layer composed of a hard carbonitride selected from the group consisting of the carbonitrides of Ti, Hf, Zr and their alloys with each other and their alloys with other elements.

6. The cutting tool according to claim 5 wherein said physical vapor deposition layer is selected from the group consisting of the nitrides and carbonitrides of Ti, Zr, Hf, their alloys with each other, and their alloys with other elements.

7. The cutting tool according to claim 6 wherein said tungsten carbide based cemented carbide has a porosity rating consisting of A, B, or A and B type porosity.

8. The cutting tool according to claim 2 wherein said physical vapor deposition layer is selected from the group consisting of the nitrides and carbonitrides of Ti, Zr, Hf, their alloys with each other, and their alloys with other elements.

9. The cutting tool according to claim 1 wherein said chemical vapor deposition layer includes a layer composed of a hard carbonitride selected from the group consisting of the carbonitrides of Ti, Hf, Zr and their alloys with each other and their alloys with other elements.

10. The cutting tool according to claim 9 wherein said physical vapor deposition layer is selected from the group consisting of the nitrides and carbonitrides of Ti, Zr, Hf, their alloys with each other, and their alloys with other elements.

11. The cutting tool according to claim 1 wherein said physical vapor deposition layer is selected from the group consisting of the nitrides and carbonitrides of Ti, Zr, Hf, their alloys with each other, and their alloys with other elements.

12. The cutting tool according to claim 1 wherein said tungsten carbide based cemented carbide has a porosity rating consisting of A, B, or A and B type porosity.

13. A cutting tool comprising:
a rake face and a flank face;
a cutting edge at a junction of said rake face and said flank face;
said cutting tool having a coating and a substrate;
wherein said substrate is a nonbinder enriched tungsten carbide based cemented carbide having a bulk composition including:
about zero weight percent Ta;
about zero weight percent Nb;
about zero weight percent Ti;
5-15 weight percent Co;
said coating having a number of layers;
said layers including at least one chemical vapor deposition layer and at least one physical vapor deposition layer;
wherein the outermost layer of said chemical vapor deposition layer and said physical vapor deposition layer is said physical vapor deposition layer;
wherein said chemical vapor deposition layer includes a layer which is adjacent to said substrate and is selected from the group consisting of the nitrides of Ti, Zr and Hf and their alloys;
and wherein said physical vapor deposition layer is in a state of residual compressive stress.

14. The cutting tool according to claim 13 wherein said chemical vapor deposition layer includes a layer composed of a hard carbonitride selected from the group consisting of the carbonitrides of Ti, Hf, Zr and their alloys with each other and their alloys with other elements.

15. The cutting tool according to claim 13 wherein said physical deposition layer is selected from the group consisting of the nitrides and carbonitrides of Ti, Zr, Hf, their alloys with each other, and their alloys with other elements.

16. The cutting tool according to claim 13 wherein said tungsten carbide based cemented carbide has a porosity rating consisting of A, B, or A and B type porosity.

17. The cutting tool according to claim 16 wherein the bulk composition further includes chromium.

* * * * *